United States Patent
Han

(10) Patent No.: US 10,784,286 B2
(45) Date of Patent: Sep. 22, 2020

(54) LOW TEMPERATURE POLYSILICON PANEL

(71) Applicant: Wuhan China Star Optoelectronics Technology Co., Ltd., Wuhan, Hubei (CN)

(72) Inventor: Yuebai Han, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 304 days.

(21) Appl. No.: 15/735,543

(22) PCT Filed: Oct. 12, 2017

(86) PCT No.: PCT/CN2017/105821
§ 371 (c)(1),
(2) Date: Dec. 11, 2017

(87) PCT Pub. No.: WO2019/047329
PCT Pub. Date: Mar. 14, 2019

(65) Prior Publication Data
US 2020/0035706 A1    Jan. 30, 2020

(30) Foreign Application Priority Data

Sep. 5, 2017   (CN) .......................... 2017 1 0791713

(51) Int. Cl.
*H01L 27/12*         (2006.01)
*G02F 1/136*         (2006.01)

(52) U.S. Cl.
CPC ............ *H01L 27/124* (2013.01); *G02F 1/136* (2013.01)

(58) Field of Classification Search
CPC ... H01L 27/12; H01L 27/124; H01L 27/1222; H01L 29/739; G02F 1/136; G02F 1/1362;
(Continued)

(56) References Cited

U.S. PATENT DOCUMENTS

2004/0018677 A1*  1/2004 Nakanishi ............... H01L 27/12
438/222

FOREIGN PATENT DOCUMENTS

| CN | 104538307 A | 4/2015 |
|---|---|---|
| JP | H11-52427 A | 2/1999 |

* cited by examiner

*Primary Examiner* — Chuong A Luu
(74) *Attorney, Agent, or Firm* — Hemisphere Law, PLLC; Zhigang Ma

(57) ABSTRACT

A low temperature polysilicon panel has an edge region, the edge region includes a polysilicon film layer and an interval spacer layer located above the polysilicon film layer; a row of dummy pixel units are provided on the interval spacer layer; a first conductive thin film layer is provided above the dummy pixel unit; a passivation layer is insulated between the dummy pixel unit and the first conductive thin film layer. The dummy pixel units includes a thin film transistor and a data line electrically connected thereto for accessing a common signal; a first hole provided on the interval spacer layer, and the polysilicon film layer electrically connected to the data line through the first hole. The low temperature polysilicon panel can lead the charge collected on the polysilicon film layer to avoid the edge wounded of the polysilicon panel and prevent the leakage of the polysilicon panel edge.

19 Claims, 3 Drawing Sheets

(58) Field of Classification Search
CPC .... G02F 1/1368; G02F 1/1343; G02F 1/1333; G02F 1/133; G02F 1/136204; G02F 1/136286; G02F 1/134363; G02F 1/133345; G02F 1/133308; G02F 1/13306; G02F 1/134336; G02F 2001/133519; G02F 2203/04; G02F 2201/121
USPC .......................................................... 257/72
See application file for complete search history.

LOW TEMPERATURE POLYSILICON PANEL

RELATED APPLICATIONS

The present application is a National Phase of International Application Number PCT/CN2017/105821, filed Oct. 12, 2017, and claims the priority of China Application No. CN 201710791713.8, filed Sep. 5, 2017.

FIELD OF THE DISCLOSURE

The present invention relates to the field of display technology, and more particularly to a low temperature polysilicon panel.

BACKGROUND

Low temperature polysilicon panels have become the star products in the current flat panel display products through its high resolution, high mobility, low power consumption and many other advantages. They are widely used in such as Apple, Samsung, Huawei, Millet, Meizu and other major mobile phone and the tablet computer. Because of complexity manufacture of the low temperature polysilicon device, ESD (Electro-Static discharge, electrostatic discharge) problem is easily generated and a large number of charge aggregation will likely cause the damage of panel edge of the gate and polysilicon film, and results in short circuit of the gate and polysilicon film. Then, the gate signal will input to the polysilicon film layer, and causes the point class bad, and this phenomenon focuses on the edge of the panel. One of the hotspots engineers solve in panel industry is how to improve the edge of the panel anti-ESD resistance.

At present, on the market of the polysilicon panel, the edge area is provided with a dummy pixel unit, the use of more of the two design options are as follows:

A as shown in FIG. 1a, a PV hole and an ILD hole are not provided on the edge of the polysilicon panel, and the interval space layer (ILD layer) between the polysilicon film layer and the dummy pixel unit is not provided with a hole. The dummy pixel unit is completely insulated from the passivation layer (PV layer) and a hole is also not arranged between the dummy pixel unit and the pixel electrode. The drawback of this first case is that the polysilicon film on the process of accumulation of static electricity cannot be released and then easily lead to injury.

B. as shown in FIG. 1b, a PV hole and an ILD hole are both arranged on an edge of the polysilicon panel, and the polysilicon film layer is completely insulated from a dummy pixel unit. The dummy pixel unit is insulated from the polysilicon film, and a hole is arranged at the passivation layer between the polysilicon film layer and the dummy pixel and the passivation layer (PV layer). The drawback of this scheme is that a hole is arranged on the passivation layer, resulting in the connection between the common electrode and the dummy pixel unit. It is liable to cause leakage of the edge of the polysilicon panel.

SUMMARY

In order to solve the above technical problems, the present invention provides a low temperature polysilicon panel which can lead to the charge of the polysilicon film layer to avoid the edge damage of the polysilicon panel, for greatly improving the anti-ESD ability of the panel and improving the product yield. The light leakage of the edge region of the polysilicon panel can be prevented.

The present invention provides a low temperature polysilicon panel comprising an edge region, the edge region comprises a polysilicon film layer and an interval spacer layer located above the polysilicon film layer, wherein a row of dummy pixel units are provided on the interval spacer layer, a first conductive thin film layer is provided above the dummy pixel unit; a passivation layer is insulated between the dummy pixel unit and the first conductive thin film layer; the edge region comprises a polysilicon film layer and an interval spacer layer located above the polysilicon film layer, wherein a row of dummy pixel units are provided on the interval spacer layer, a first conductive thin film layer is provided above the dummy pixel unit; a passivation layer is insulated between the dummy pixel unit and the first conductive thin film layer; a first hole is provided on the interval spacer layer, and the polysilicon film layer is electrically connected to the data line through the first hole.

Preferably, a gate insulating layer is provided between the interval space layer and the polysilicon film layer; the thin film transistor comprises a gate electrode, a drain electrode, and a source electrode, the gate electrode is located between the interval spacer layer and the gate insulating layer, the source electrode, and the drain electrode is located on the interval spacer layer; the first hole is opposed to the drain and the source, and a second hole is arranged at a position the gate insulating layer opposite to the first hole; the data line is electrically connected to the source electrode, and the source electrode and the drain electrode are connected to the polysilicon film layer through the first hole and the second hole.

Preferably, the dummy pixel unit is a pixel unit located at the most outer edge region.

Preferably, the data line input voltage is 0.1~0.4V.

Preferably, a substrate is arranged below the polysilicon film layer, and a buffer layer is made between the polysilicon film layer and the substrate.

Preferably, a planarization layer is made on the interval spacer layer.

Preferably, the buffer layer comprises SiN and/or SixOy, wherein, x≥1, y≥1.

Preferably, a second conductive film layer is made between the planarization layer and the passivation layer.

Preferably, the first conductive thin film layer is a pixel electrode, and the second conductive film layer is a common electrode.

Preferably, the first conductive film layer and the second conductive thin film semiconductor layer are indium tin oxide transparent conductive film.

The present invention also provides a low temperature polysilicon panel comprising an edge region, and the edge region comprises a polysilicon film layer and an interval spacer layer located above the polysilicon film layer; a row of dummy pixel units are provided on the interval spacer layer, a first conductive thin film layer is provided above the dummy pixel unit; a passivation layer is insulated between the dummy pixel unit and the first conductive thin film layer; the dummy pixel unit in the column comprises a thin film transistor and a data line electrically connected to the thin film transistor for accessing a common signal; a first hole is provided on the interval spacer layer, and the polysilicon film layer is electrically connected to the data line through the first hole; a gate insulating layer is further provided between the interval spacer layer and the polysilicon film layer; the thin film transistor comprises a gate electrode, a drain electrode, a source electrode; the gate electrode is located between the interval spacer layer and the gate insulating layer, the source electrode and the drain electrode is located on the interval spacer layer; the first hole is opposed to the drain and the source, and a second hole is arranged at a position the gate insulating layer opposite to the first hole; the data line is electrically connected to the source electrode, and the source electrode and the drain electrode are connected to the polysilicon film layer through the first hole and the second hole.

Preferably, the dummy pixel unit is a pixel unit located at the most outer edge region.

Preferably, the data line input voltage is 0.1~0.4V; a substrate is arranged below the polysilicon film layer, and a buffer layer is made between the polysilicon film layer and the substrate; the interval spacer layer is provided with a flat layer.

Preferably, the buffer layer comprises SiN and/or $SixOy$, wherein $x≥1$, $y≥1$; a second conductive thin film layer is provided between the flat layer and the passivation layer.

Preferably, the first conductive thin film layer is a pixel electrode, the second conductive film layer as a common electrode;

Preferably, the first conductive film layer and the second conductive thin film semiconductor layer are indium tin oxide transparent conductive film.

The present invention also provides a low temperature polysilicon panel comprising an edge region, the edge region comprises a polysilicon film layer and an interval spacer layer located above the polysilicon film layer; a row of dummy pixel units are provided on the interval spacer layer, a first conductive thin film layer is provided above the dummy pixel unit; a passivation layer is insulated between the dummy pixel unit and the first conductive thin film layer; the dummy pixel unit comprises a row of thin film transistors and a data line electrically connected to the thin film transistor for accessing a common signal; a first hole is provided on the interval spacer layer, and the polysilicon film layer is electrically connected to the data line through the first hole; the interval spacer layer is provided with a flat layer.

Preferably, the interval spacer layer is provided with a flat layer; the thin film transistor comprises a gate electrode, a drain electrode, a source electrode; the gate electrode is located between the interval spacer layer and the gate insulating layer, the source electrode and the drain electrode is located on the interval spacer layer; the first hole is opposed to the drain electrode and the source electrode, and a second hole is arranged at a position the gate insulating layer opposite to the first hole; the data line is electrically connected to the source electrode, and the source electrode and the drain electrode are connected to the polysilicon film layer through the first hole and the second hole.

Preferably, the dummy pixel unit is an pixel unit located at the most outer edge region; the data line input voltage is 0.1~0.4V.

Preferably, a substrate is arranged below the polysilicon film layer, and a buffer layer is made between the polysilicon film layer and the substrate; the buffer layer comprises SiN and/or $SixOy$, wherein $x≥1$, $y≥1$.

Preferably, a second conductive thin film layer is made between the flat layer and the passivation layer; the first conductive thin film layer is a pixel electrode, the second conductive film layer as a common electrode; the first conductive film layer and the second conductive thin film semiconductor layer are indium tin oxide transparent conductive film.

The invention has the following beneficial effects: a low temperature polysilicon panel provided by the invention has an interval space layer between the dummy pixel unit and the polysilicon film layer on the edge area of the panel, and the polysilicon film layer is connected with the data line of the dummy pixel unit. The data lines on the unit are electrically connected so that the charge collected on the polysilicon film layer can be guided through the data line to avoid the edge damage of the polysilicon panel, greatly improve the anti-ESD capability of the panel is improved greatly and the product yield is enhanced. Next, the first conductive thin film layer is completely insulated from the dummy pixel unit. The dummy pixel unit and the first conductive film layer are prevented from being turned on, thereby light leakage at the edge of the polysilicon panel can be avoided.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The present invention provides a low temperature polysilicon panel including an edge region.

Figure 1A:
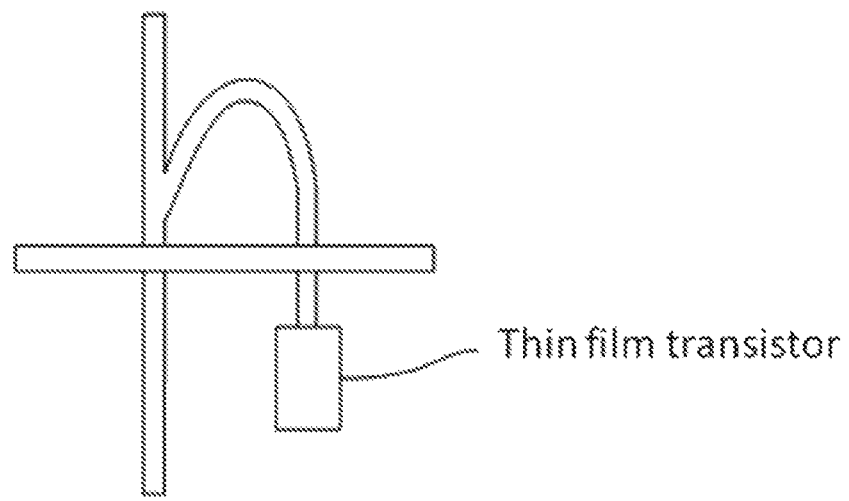
FIG. 1a is a plan view of the dummy pixel unit of a low temperature polysilicon panel edge of the first aspect of the present invention provided in the background of the present invention.
Figure 1B:
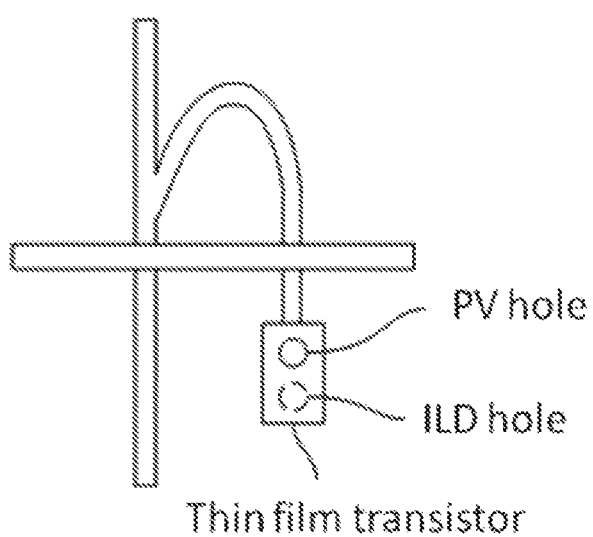
FIG. 1b is a plan view of a dummy pixel unit of a low temperature polysilicon panel in a second aspect of the present invention provided in the background of the present invention.
Figure 2:
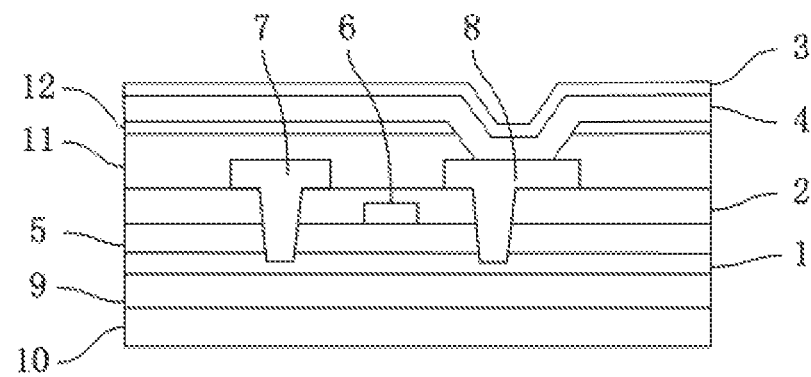
FIG. 2 is a cross-sectional view of the edge region of the low temperature polysilicon panel provided by the present invention.

As shown in FIG. 2, the edge region 2 includes a polysilicon film layer 1 and an interval spacer layer 2 (i.e., ILD layer) located on a polysilicon film layer. A row of a dummy pixel unit is provided with the interval spacer layer 2. A first conductive thin film layer 3 is disposed above the dummy pixel unit, and the dummy pixel unit and the first conductive thin film layer 3 are insulated from each other through the passivation layer 4. The row of the dummy pixel unit includes a thin film transistor and a data line electrically connected to the thin film transistor for accessing the common signal.

In general, the voltage at the end of the common signal (i.e., the common signal output) is close to 0V and can be approximated as grounded, i.e., the charge of the polysilicon film 1 is grounded. The potential which the charge collected on the polysilicon film 1 is higher than one of an end of the common signal, Thereby, in the polysilicon panel of the present invention, the charges collected on the polysilicon film layer are conducted away through the data line. The polysilicon panel of the present invention can avoid the charge damage and greatly improve panel ESD (Electro-Static Discharge) capacity of the polysilicon film 1, and improve product yield.

Second, when the dummy pixel unit is totally insulated from the first conductive film layer 3, the dummy pixel unit is not connected to the first conductive film layer 3 electrically to form a loop. The dummy pixel units do not receive the common signal, for controlling the polysilicon panel display. Therefore, the present invention will not have any effect on the display of polysilicon panels, nor it will cause light leakage at the edge of the polysilicon panel.

Figure 3:
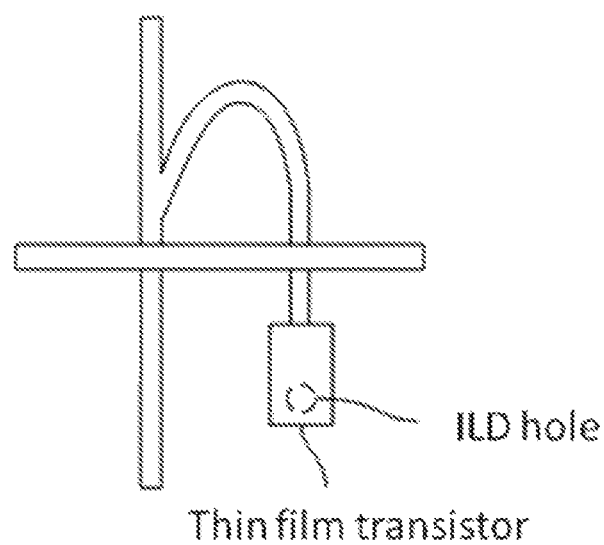
FIG. 3 is a plan view of a virtual pixel unit at an edge region of a low temperature polysilicon panel provided by the present invention.
Figure 4:
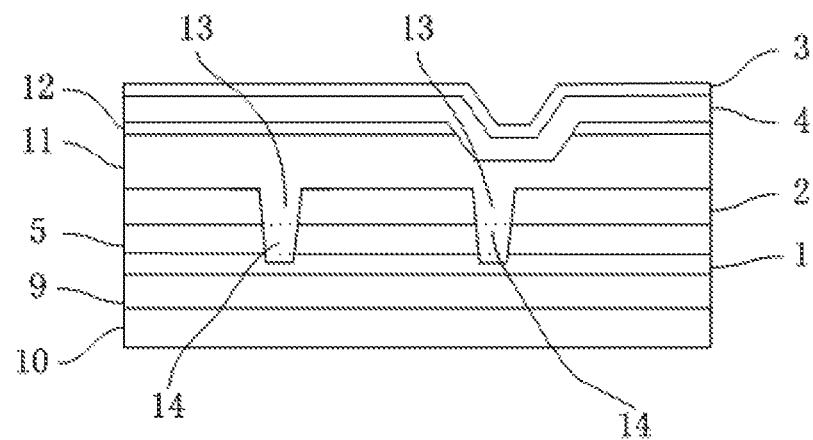
FIG. 4 is a cross-sectional view of another embodiment of a thin film transistor not shown in the edge region of the low temperature polysilicon panel provided by the present invention.

As shown in FIG. 3, an ILD hole is not arranged on the upper edge of the polysilicon film layer, as shown in FIG. 4. The interval space layer 2 is provided with a first hole 13, and the polysilicon film layer 1 connects to the data line through the first hole 13. The dummy pixel unit is insulated from the first conductive thin film layer 3, and specifically, the passivation layer 4 is not provided with a hole.

Further, with continued reference to FIG. 2, a gate insulating layer 5 is arranged between a polysilicon film layer 2 and the interval space layer.

The thin film transistor includes a gate electrode 6, a drain electrode 8, and a source electrode 7.

The gate electrode 6 is located between the interval spacer layer 2 and the gate insulating layer 5, and the source electrode 7 and the drain electrode 8 are located on the interval spacer layer 2.

With continued reference to FIG. 4, the thin film transistor has two corresponding first holes 13, and the two first holes 13 are located at an opposite position respectively to the drain electrode 8 and the source electrode 7. A second hole 14 is arranged at the gate insulting layer 5 and the first hole 13. The data line connects with to the source electrode 7. The source electrode 7 and the drain electrode 8 connects with the polysilicon film layer 1 through the first hole 13 and the second hole 14.

Further, the dummy pixel unit is a pixel unit located at the most outer edge region.

Further, the voltage at the input of the data line is 0.1 to 0.4V, and the input of the data line refers to the input of the common signal. Thereby, the input voltage at the data line is 0.1~0.4V, i.e., the voltage of the common signal output is 0.1~0.4V. The potential of the charged charge formed on the polysilicon film layer 1 is generally greater than 0.4V, so that the charges accumulated on the polysilicon film layer 1 can be guided through the data lines.

Further, a substrate 10 is arranged below the polysilicon film layer 1, and a buffer layer 9 is provided between the polysilicon film layer 1 and the substrate 10. The substrate 10 may be a glass substrate.

Further, the flat layer 11 is provided on the interval spacer layer 2.

Further, the buffer layer 9 includes SiN and/or SixOy, where x≥1, y≥1.

Further, a second conductive thin film layer 12 is provided between the flat layer 11 and the passivation layer 4.

Further, the first conductive thin film layer 3 is a pixel electrode, and the second conductive thin film layer 12 is a common electrode.

Further, both the first conductive thin film layer 3 and the second conductive thin film layer 12 are indium tin oxide semiconductor transparent conductive films, i.e. ITO thin films.

The polysilicon panel also includes an effective display area, and the edge region is an extension of the effective display area. An effective display region comprises a polysilicon film layer 1and an interval spacer film 2 over the polysilicon film layer 1, a gate insulating layer 5 is arranged between a polysilicon film layer 2 and the interval space layer; a plurality of rows of the real pixel units are arranged on the interval spacer layer 2. Each row of the real pixel unit includes a row of a thin film transistor, and the gate 6 of the thin film transistor is located between the gate insulating layer 2 and the spacer layer 5. A source electrode 7 and the drain layer 8 are located below the interval spacer layer 2.

The passivation layer 4 is prepared on the source 7 and the drain electrode 8, and a pixel electrode is prepared over the passivation layer 4. Holes are arranged between the gate insulating layer 5 and the interval spacer layer 2; the source layer 7 and the drain 8. The hole connects with the polysilicon film layer 1 through the source electrode 8 and the drain electrode 8. Moreover, a hole is arranged the position on the passivation layer 4 and drain electrode 8. The drain electrode 8 connects through the hole and the pixel electrode. A data line electrically connected to the thin film transistor for accessing a common signal. The common signal can be transferred to the pixel electrode through the thin film transistor for controlling the display of the panel after the film transistor and the pixel electrode are turned on.

As described above, according to the present invention, a low temperature polysilicon panel of the present invention, on the edge region of the panel, arranges the hole on the interval spacer layer 2 between the dummy pixel unit and the polysilicon film layer 1. The data lines are electrically connected so that the charges accumulated on the polysilicon film layer 1 can be guided through the data lines to avoid the edge of the polysilicon panel. Thereby, the ESD resistance of the panel is greatly improved and the product yield is enhanced. Next, the first conductive thin film layer 3 is completely insulated from the dummy pixel unit, and the dummy pixel unit connects with the first conductive film layer for preventing light leakage at the edge of the polysilicon panel.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A low temperature polysilicon panel, comprising an edge region, wherein the edge region comprises a polysilicon film layer and an interval spacer layer located above the polysilicon film layer, a row of dummy pixel units are provided on the interval spacer layer, a first conductive thin film layer is provided above the dummy pixel unit; a passivation layer is insulated between the dummy pixel unit and the first conductive thin film layer;

the dummy pixel unit in the row comprises a thin film transistor and a data line electrically connected to the thin film transistor for accessing a common signal;

a first hole is provided on the interval spacer layer, a groove is provided on the polysilicon film layer, and the polysilicon film layer is electrically connected to the data line through the first hole and the groove.

2. The low temperature polysilicon panel according to claim 1, wherein a gate insulating layer is provided between the interval space layer and the polysilicon film layer;

the thin film transistor comprises a gate electrode, a drain electrode, and a source electrode;

the gate electrode is located between the interval spacer layer and the gate insulating layer, the source electrode and the drain electrode are located on the interval spacer layer;

wherein the first hole is opposed to the drain and the source, and a second hole is arranged at a position the gate insulating layer opposite to the first hole;

wherein the data line is electrically connected to the source electrode, the source electrode and the drain electrode are connected to the polysilicon film layer through the first hole and the second hole.

3. The low temperature polysilicon panel according to claim 1, wherein the dummy pixel unit is a row of pixel units located at the most outer edge region.

4. The low temperature polysilicon panel according to claim 1, wherein the data line input voltage is 0.1~0.4V.

5. The low-temperature polysilicon panel according to claim 1, wherein a substrate is arranged below the polysilicon film layer, and a buffer layer is made between the polysilicon film layer and the substrate.

6. The low-temperature polysilicon panel according to claim 1, wherein a planarization layer is made on the interval spacer layer.

7. The low temperature polysilicon panel according to claim 5, wherein the buffer layer comprises SiN and/or SixOy, wherein, x≥1, y≥1.

8. The low temperature polysilicon panel according to claim 6, wherein a second conductive film layer is made between the planarization layer and the passivation layer.

9. The low temperature polysilicon panel according to claim 8, wherein the first conductive thin film layer is a pixel electrode, and the second conductive film layer is a common electrode.

10. The low temperature polysilicon panel according to claim 8, wherein the first conductive film layer and the second conductive thin film semiconductor layer are indium tin oxide transparent conductive film.

11. A low temperature polysilicon panel comprising an edge region, wherein the edge region comprises a polysilicon film layer and an interval spacer layer located above the polysilicon film layer; a row of dummy pixel units are provided on the interval spacer layer, a first conductive thin film layer is provided above the dummy pixel unit; a passivation layer is insulated between the dummy pixel unit and the first conductive thin film layer;

the dummy pixel unit in the column comprises a thin film transistor and a data line electrically connected to the thin film transistor for accessing a common signal;

a first hole is provided on the interval spacer layer, and the polysilicon film layer is electrically connected to the data line through the first hole;

a gate insulating layer is further provided between the interval spacer layer and the polysilicon film layer;

the thin film transistor comprises a gate electrode, a drain electrode, a source electrode;

the gate electrode is located between the interval spacer layer and the gate insulating layer, the source electrode and the drain electrode are located on the interval spacer layer;

wherein the first hole is opposed to the drain and the source, and a second hole is arranged at a position the gate insulating layer opposite to the first hole;

wherein the polysilicon film layer further comprises a groove provided on an upper surface facing the second hole;

wherein the data line is electrically connected to the source electrode, and the source electrode and the drain electrode are connected to the polysilicon film layer through the first hole, the second hole and the groove.

12. The low-temperature polysilicon panel according to claim 11, wherein the dummy pixel unit is a row of pixel units located at the most outer edge region.

13. The low temperature polysilicon panel according to claim 11, wherein the data line input voltage is 0.1~0.4V;

a substrate is arranged below the polysilicon film layer, and a buffer layer is made between the polysilicon film layer and the substrate;

the interval spacer layer is provided with a flat layer.

14. The low temperature polysilicon panel according to 13, wherein the buffer layer comprises SiN and/or SixOy, wherein x≥1, y≥1;

and a second conductive thin film layer is made between the flat layer and the passivation layer.

15. The low temperature polysilicon panel according to claim 14, wherein the first conductive thin film layer is a pixel electrode, the second conductive film layer as a common electrode;

the first conductive film layer and the second conductive thin film semiconductor layer are indium tin oxide transparent conductive film.

16. A low temperature polysilicon panel comprising an edge region, wherein the edge region comprises a polysilicon film layer and an interval spacer layer located above the polysilicon film layer; a row of dummy pixel units are provided on the interval spacer layer, a first conductive thin film layer is provided above the dummy pixel unit; a passivation layer is insulated between the dummy pixel unit and the first conductive thin film layer;

the dummy pixel unit comprises a row of thin film transistors and a data line electrically connected to the thin film transistor for accessing a common signal;

a first hole is provided on the interval spacer layer, and the polysilicon film layer is electrically connected to the data line through the first hole;

wherein a gate insulating layer is arranged between the interval space layer and the polysilicon film layer;

the thin film transistor comprises a gate electrode, a drain electrode, a source electrode;

the gate electrode is located between the interval spacer layer and the gate insulating layer, the source electrode and the drain electrode is located on the interval spacer layer;

wherein the first hole is opposed to the drain and the source, and a second hole is arranged at a position the gate insulating layer opposite to the first hole;

wherein the polysilicon film layer further comprises a groove provided on an upper surface facing the second hole;

wherein the data line is electrically connected to the source electrode, and the source electrode and the drain electrode are connected to the polysilicon film layer through the first hole, the second hole and the groove;

the interval spacer layer is provided with a flat layer.

17. The low temperature polysilicon panel according to claim 16, wherein the dummy pixel unit is a row of pixel units located at the most outer edge region, andthe data line input voltage is 0.1~0.4V.

18. The low temperature polysilicon panel according to claim 16, wherein a substrate is arranged below the polysilicon film layer, and a buffer layer is made between the polysilicon film layer and the substrate;
   the interval spacer layer is provided with a flat layer;
   the buffer layer comprises SiN and/or SixOy, wherein $x \geq 1$, $y \geq 1$.

19. The low temperature polysilicon panel according to claim 16, wherein a second conductive thin film layer is made between the flat layer and the passivation layer;
   the first conductive thin film layer is a pixel electrode, the second conductive film layer as a common electrode;
   the first conductive film layer and the second conductive thin film semiconductor layer are indium tin oxide transparent conductive film.

\* \* \* \* \*